(12) United States Patent
Bolatkale et al.

(10) Patent No.: US 10,164,807 B2
(45) Date of Patent: Dec. 25, 2018

(54) RECEIVER CIRCUITS

(71) Applicant: NXP B.V., Eindhoven (NL)

(72) Inventors: Muhammed Bolatkale, Eindhoven (NL); Lucien Johannes Breems, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/481,038

(22) Filed: Apr. 6, 2017

(65) Prior Publication Data

US 2017/0317860 A1 Nov. 2, 2017

(30) Foreign Application Priority Data

Apr. 28, 2016 (EP) ..................... 16167566

(51) Int. Cl.
*H03M 1/00* (2006.01)
*H03M 1/10* (2006.01)
*H04B 1/00* (2006.01)
*H04B 1/10* (2006.01)
(Continued)

(52) U.S. Cl.
CPC ............ *H04L 25/08* (2013.01); *H03M 1/001* (2013.01); *H03M 1/1009* (2013.01); *H04B 1/109* (2013.01); *H04B 1/123* (2013.01); *H04B 1/0007* (2013.01)

(58) Field of Classification Search
CPC .. H03M 1/001; H03M 1/1009; H04B 1/0007; H04B 1/109; H04B 1/123; H04L 25/08
See application file for complete search history.

(56) References Cited

U.S. PATENT DOCUMENTS

| 3,975,607 A * | 8/1976 | Ullmann ................. B23H 7/20 219/69.17 |
| 4,903,023 A | 2/1990 | Evans |

(Continued)

FOREIGN PATENT DOCUMENTS

WO 200432348 A1 4/2004

OTHER PUBLICATIONS

Dong, Y. et al. "A Continuous-Time 0—3 MASH ADC Achieving 88 dB DR With 53 MHz BW in 28 nm CMOS", IEEE Journal of Solid-State Circuits, vol. 49, No. 12, pp. 2868-2877 (Dec. 2014).

*Primary Examiner* — David B Lugo
(74) *Attorney, Agent, or Firm* — Rajeev Madnawat

(57) ABSTRACT

A receiver circuit comprising: an input terminal configured to receive an input-signal; a feedforward-ADC configured to provide a feedforward-digital-signal based on the input-signal; a feedforward-DAC configured to provide a feedforward-analog-signal based on the feedforward-digital-signal; a feedforward-subtractor configured to provide an error-signal based on the difference between the feedforward-analog-signal and the input-signal; an error-LNA configured to provide an amplified-error-signal based on the error-signal; an error-ADC configured to provide a digital-amplified-error-signal based on the amplified-error-signal; a mixer configured to down-convert a signal in a signal path between the input terminal and the error-ADC; and an error-cancellation-block configured to provide an error-cancelled-signal based on a difference between the digital-amplified-error-signal and the feedforward-digital-signal.

16 Claims, 8 Drawing Sheets

(51) Int. Cl.
    *H04B 1/12*      (2006.01)
    *H04L 25/08*     (2006.01)

(56)            References Cited

U.S. PATENT DOCUMENTS 5,353,027  A  * 10/1994  Vorenkamp ........... H03M 1/069
                                                    341/118
    5,771,012  A  *  6/1998  Shu ..................... H03M 1/1009
                                                    341/118
    5,812,077  A     9/1998  Boie
    6,564,194  B1 *  5/2003  Koza ..................... G05B 11/42
                                                      706/13
    6,721,701  B1 *  4/2004  Goss .................. G10L 19/0018
                                                     704/231
    8,188,901  B1 *  5/2012  Inamdar .................. H03M 3/02
                                                     341/133
    8,503,507  B2    8/2013  Kianush et al.
 2011/0075768  A1 *  3/2011  Zhan ...................... H03M 1/46
                                                     375/340
 2011/0227785  A1 *  9/2011  Sakurai ................ G01S 13/345
                                                     342/200
 2014/0104086  A1 *  4/2014  Zhang ................ H03M 1/1009
                                                     341/120
 2017/0077940  A1 *  3/2017  Yoshioka ............ H03M 1/1245

* cited by examiner

RECEIVER CIRCUITS

CROSS-REFERENCE TO RELATED APPLICATIONS

This application claims the priority under 35 U.S.C. § 119 of European Patent application no. 16167566.5, filed on Apr. 28, 2016, the contents of which are incorporated by reference herein.

The present disclosure relates to receiver circuits, and in particular to receiver circuits for processing input signals that include one or more blockers.

According to a first aspect of the present disclosure there is provided a receiver circuit comprising:

an input terminal configured to receive an input-signal;
a feedforward-ADC configured to provide a feedforward-digital-signal based on the input-signal;
a feedforward-DAC configured to provide a feedforward-analogue-signal based on the feedforward-digital-signal;
a feedforward-subtractor configured to provide an error-signal based on the difference between the feedforward-analogue-signal and the input-signal;
an error-LNA configured to provide an amplified-error-signal based on the error-signal;
an error-ADC configured to provide a digital-amplified-error-signal based on the amplified-error-signal;
a mixer configured to down-convert a signal in a signal path between the input terminal and the error-ADC; and
an error-cancellation-block configured to provide an error-cancelled-signal based on a difference between the digital-amplified-error-signal and the feedforward-digital-signal.

The use of such a mixer can relax the requirements of one or more of the error-ADC, the feedforward-ADC and the feedforward-DAC, without significantly negatively affecting the quality of the error-cancelled-signal.

In one or more embodiments the mixer comprises one or more of:

an input-mixer configured to down-convert the input-signal in order to provide a down-converted-input-signal, wherein the feedforward-ADC is configured to provide the feedforward-digital-signal based on the down-converted-input-signal, and wherein the feedforward-subtractor is configured to provide the error-signal based on the difference between the feedforward-analogue-signal and the down-converted-input-signal;
an error-mixer configured to down-convert the error-signal in order to provide a down-converted-error-signal, wherein the error-LNA is configured to provide the amplified-error-signal based on the down-converted-error-signal;
a feedforward-input-mixer configured to down-convert the input-signal in order to provide a down-converted-input-signal, wherein the feedforward-ADC is configured to provide the feedforward-digital-signal based on the down-converted-input-signal, the feedforward-subtractor is configured to provide the error-signal based on the difference between the feedforward-analogue-signal and the input-signal, and wherein the signal that is provided as an input to the feedforward-ADC is a down-converted version of the signal that is provided as an input to the feedforward-subtractor;
a feedforward-analogue-mixer configured to down-convert the feedforward-analogue-signal in order to provide a down-converted-feedforward-analogue-signal, wherein the feedforward-subtractor is configured to provide an error-signal based on the difference between the down-converted-feedforward-analogue-signal and the input-signal;
a feedforward-digital-mixer configured to down-convert the feedforward-digital-signal in order to provide a down-converted-feedforward-digital-signal, wherein the feedforward-DAC is configured to provide the feedforward-analogue-signal based on the down-converted-feedforward-digital-signal; and
inherent aliasing characteristics of the feedforward-ADC and the feedforward-DAC.

In one or more embodiments the feedforward-ADC comprises a wideband ADC and/or the feedforward-DAC comprises a wideband DAC. The error-ADC may comprise a narrowband ADC. The error-ADC may comprise a plurality of ADCs in parallel with each other.

In one or more embodiments the receiver circuit further comprises a delay-block configured to provide a delayed-input-signal based on the input-signal. The feedforward-subtractor may be configured to provide the error-signal based on the difference between the feedforward-analogue-signal and the delayed-input-signal.

In one or more embodiments the receiver circuit further comprises:

an interference-input terminal configured to receive an interference-input-signal representative of a transmitted-signal from a co-located transmitter; and
an interference-compensator configured to provide a compensated-input-signal based on the interference-input-signal and the input-signal, wherein the feedforward-ADC is configured to provide the feedforward-digital-signal based on the compensated-input-signal, and wherein the feedforward-subtractor is configured to provide the error-signal based on the difference between the feedforward-analogue-signal and the compensated-input-signal.

In one or more embodiments the interference-compensator comprises an interference-cancellation-block configured to generate a modelled-interference-signal based on: (i) a model of a signal coupling path between transmitter and receiver antennas; and (ii) the interference-input-signal. The interference-compensator may be configured to provide the compensated-input-signal based on the modelled-interference-input-signal and the input-signal.

In one or more embodiments the interference-compensator is configured to be operated in accordance with an operating-state of the transmitter.

In one or more embodiments the receiver circuit further comprises a digital-noise-shaper configured to generate a 1-bit noise-shaped-feedforward-signal based on the feedforward-digital-signal. The feedforward-DAC may be configured to provide the feedforward-analogue-signal based on the noise-shaped-feedforward-signal.

In one or more embodiments the receiver circuit further comprises a calibration-feedback-path configured to provide a calibration-error-signal based on the amplified-error-signal to the error-cancellation-block. The error-cancellation-block may be configured to set component/operational parameters for one or more components in a signal path between the input terminal and the error-ADC.

In one or more embodiments the feedforward-DAC comprises a multi-tap FIRDAC.

An integrated circuit comprising any receiver circuit, system or other circuit disclosed herein.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

One or more embodiments will now be described by way of example only with reference to the accompanying drawings in which.

Signal conditioning is often required in wideband receivers and ADCs. The maximum level of a signal present in an integrated circuit is often limited to the available supply voltage range. Amplifying the signal higher than the supply level may not be possible, and therefore this can limit a maximum gain that can be implemented in the rest of the signal conditioning chain.

Figure 1:
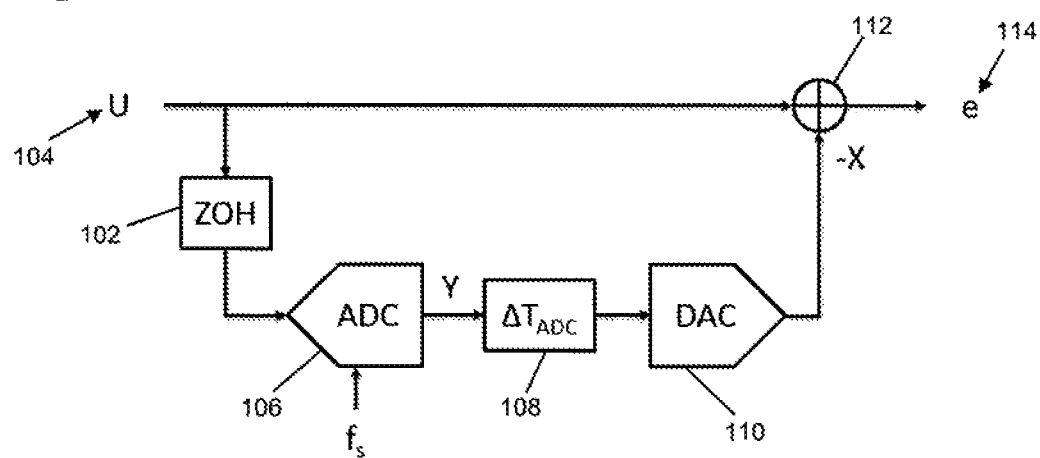
FIG. 1 shows a circuit that includes a feedforward signal cancellation path.

FIG. 1 shows a circuit that includes a feedforward signal cancellation path, which can be used to reduce signal levels. The feedforward path includes a zero-order-hold (ZOH) block 102 which samples an input signal (U) 104, a feedforward-analogue-to-digital converter (ADC) 106 which converts the sampled input signal (U) 104 to a digital (Y) signal, and a feedforward-digital-to-analogue converter (DAC) 110 which generates an analogue replica of the input signal (X). The feedforward-ADC 106 converts the input signal 104 using a sampling frequency (fs). The circuit of FIG. 1 also includes a subtractor 112 that subtracts the analogue replica of the input signal (X) from the input signal (U) 104 in order to provide an error signal (e) 114. Assuming that the sampling frequency and the resolution of the feedforward-ADC 106 are very high, and the rest of the blocks are ideal, then the error signal (e) can be expressed as:

$$e = U - X \quad (1)$$

$$X = U + e_q \quad (2)$$

$$e = -e_q \quad (3)$$

where $e_q$ is the quantization noise of the feedforward-ADC 106. The amplitude of the error signal (e) 114 is only limited by the resolution of the feedforward-ADC 106. Moreover, the digital output (Y) of the feedforward-ADC 106 is used separately (not shown) to reconstruct the input signal. It will be appreciated that other implementations of the feedforward compensation path are possible, for example by means of an analogue filter.

Figure 2:
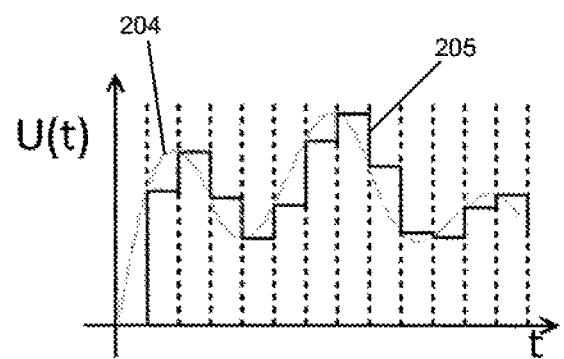
FIG. 2 illustrates, in the time domain, a plot of example signals in the circuit of FIG. 1.

FIG. 2 illustrates, in the time domain, a plot of an example analogue input signal (U) 204 to the ZOH block of FIG. 1, and also a corresponding output signal 205 of the ZOH block. As shown in FIG. 2, the ZOH block introduces a time delay. The ZOH block samples the input signal (U) 204 and holds it for one clock period. However, the input signal (U) 204 changes during the hold duration. Therefore, the output signal 205 of the ZOH block only matches the input signal (U) 204 at the sampling moments as illustrated in FIG. 2.

Returning to FIG. 1, the feedforward-ADC 106 has a propagation time delay, which is shown in the figure by a time delay block ($\Delta T_{ADC}$) 108. The time delay can be due to the limited speed of the building blocks of the feedforward-ADC 106. In addition to the delay of the ZOH block 102, the propagation delay of the feedforward-ADC 106 can further reduce the effectiveness of the feedforward signal cancellation technique. This propagation delay could be for example equal to 1 or more sampling clock periods.

Figure 3:
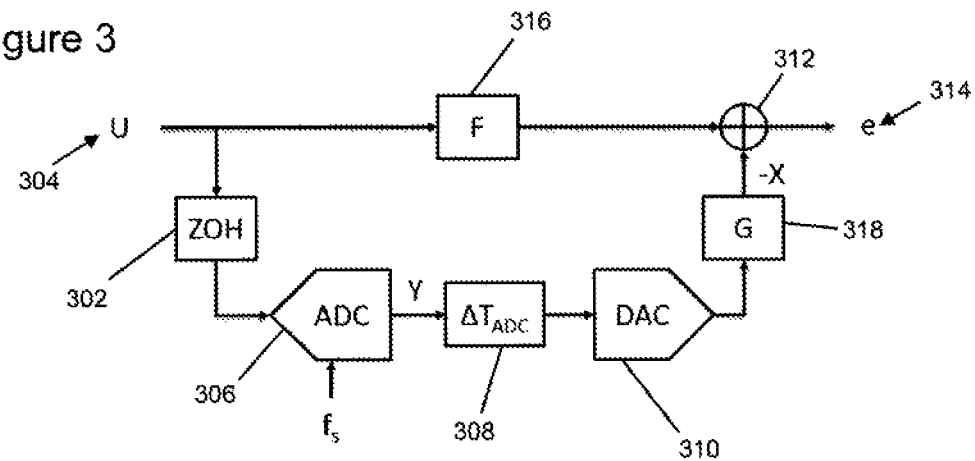
FIG. 3 shows another circuit that includes a feedforward signal cancellation path.

FIG. 3 shows another circuit that includes a feedforward signal cancellation path. Features of FIG. 3 that have already been discussed with reference to FIG. 1 will not necessarily be described again here. The circuit of FIG. 3 can reduce the undesired effects of the propagation delays that are discussed above with reference to FIGS. 1 and 2.

In order to address the fact that the outputs of the ZOH block 302 only match the input signal (U) 304 at the sampling moments, a reconstruction filter (G) 318 is added to the feedforward path such that a continuous-time representation of the input signal (X) is provided at the output of the reconstruction filter (G) 318. In this example, the reconstruction filter (G) 318 is connected between the output of the feedforward-DAC 310 and the input to the subtractor 312.

The delay introduced by the feedforward-ADC 306 in the feedforward chain is compensated in FIG. 3 by introducing a compensation-filter (F) 316 in the signal path that the input signal (U) 304 takes to the subtractor 312. In this way, the compensation-filter (F) 316 provides a delayed version of the input signal as an input to the subtractor 312. Moreover, the compensation-filter (F) 316 can also compensate an additional delay that is introduced by the reconstruction filter (G).

Advantageously, the input signal (U) 304 is only sampled by the feedforward path. Therefore, the error signal (e) 314 that is output by the subtractor 312 also contains the inverse of any aliased components.

Assuming that the error signal (e) 314 is quantized by an ideal ADC (not shown) and subtracted from the output signal (Y) from the feedforward-ADC 306, the aliased components and the quantization noise of the feedforward-ADC 306 are cancelled. As a result, an additional anti-alias filter may not be required in the feedforward path.

The reconstruction filter (G) 318 can be implemented as a low pass filter. This filter will generate a continuous-time representation of the sampled signal.

The compensation-filter (F) 316 can be implemented as an all-pass filter. The signal gain can be set to unity and the delay introduced by this block can be designed to match the delay of the feedforward path in the frequency of interest.

For the circuit of FIG. 3, the error signal (e) 314 is limited by the quantization noise of the feedforward-ADC 306. Therefore, if needed, an additional gain block can be introduced to further suppress the non-idealities of the blocks placed after it.

Figure 4:
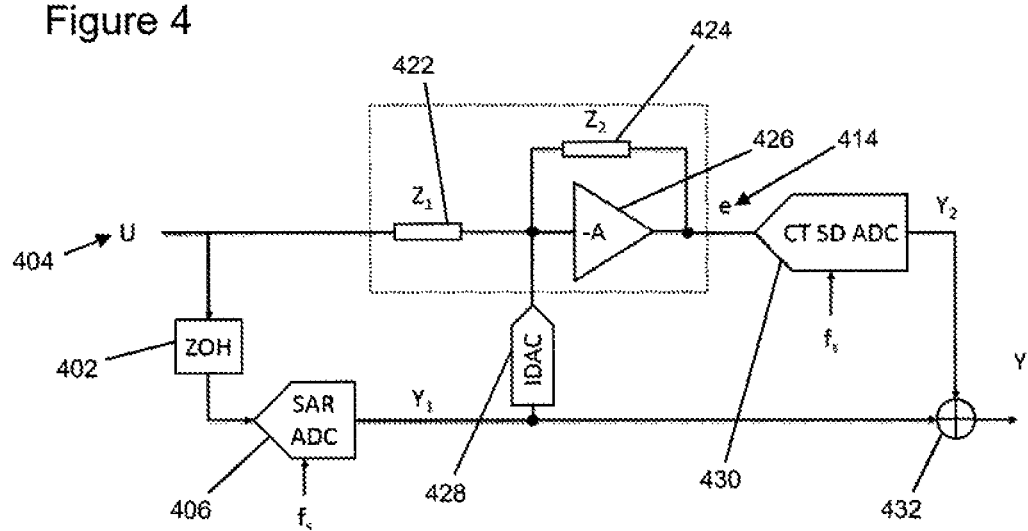
FIG. 4 shows an ADC architecture that includes the feedforward cancellation technique of FIG. 3.

FIG. 4 shows an ADC architecture that includes the feedforward cancellation technique of FIG. 3. An input signal (U) 404 is converted to a digital signal by a successive-approximation-register (SAR) ADC 406, which is an example of a feedforward-ADC 406, and its output signal (feedforward-digital-signal) is indicated as $Y_1$. The feedforward-ADC 406 converts both a desired signal and unwanted blockers (in band and out of band components). The digital output signal $Y_1$ is converted to an analogue signal (feedforward-analogue-signal) by an IDAC 428 (a current-DAC), which is an example of a feedforward-DAC.

To reconstruct the input signal, a low pass filter is implemented to smooth the sampled signal in the feedforward path, as discussed above. In this way, the low pass filter provides the functionality of a reconstruction filter.

The low pass filter includes a filter-amplifier 426 and a filter-feedback-impedance $Z_2$ 424. The input terminal of the filter-amplifier 426 is connected to the output terminal of the IDAC 428. An output terminal of the SAR ADC 406 is connected to the input terminal of the filter-amplifier 426. The filter-feedback-impedance $Z_2$ 424 has a first terminal that is connected to an output terminal of the filter-amplifier 426, and has a second terminal that is connected to the input terminal of the filter-amplifier 426. The output terminal of the filter-amplifier 426 provides the error signal (e) 414. In this way, the transfer function for the signal that is received from the IDAC 428 is defined by Vout/Idac=$Z_2$, in that the filter-feedback-impedance $Z_2$ 424 defines the cut-off frequency of the low pass filter.

To compensate the delay in the feedforward cancellation path, the input signal (U) 404 is delayed by a compensation-filter, which is implemented as an all pass filter. The all pass filter includes the filter-amplifier 426, the filter-feedback-impedance $Z_2$ 424 and a filter-input-impedance $Z_1$ 422. The filter-input-impedance $Z_1$ 422 has a first terminal that is connected to a circuit-input-terminal that receives the input signal (U) 404. The filter-input-impedance $Z_1$ 422 has a second terminal that is connected to an input terminal of the filter-amplifier 426. In this way, the transfer function for the signal that is received from the circuit-input-terminal is defined by Vout/U=$Z_2/Z_1$.

The circuit of FIG. 4 also includes a continuous-time sigma-delta ADC 430 that converts the error signal (e) 414 to a digital-error-signal ($Y_2$). An adder 432 is also included, which adds the digital-error-signal ($Y_2$) from the feedforward-digital-signal that is provided by the feedforward-ADC 406 ($Y_1$). The adder 432 provides the final digital output signal (Y) as the sum of $Y_1$ and $Y_2$. Advantageously, the circuit of FIG. 4 can convert an analogue input signal to a digital output signal, using a relatively coarse SAR ADC 406, such that a quantization noise of the SAR ADC 406 has a reduced effect on the output because it is cancelled out by the error signal.

It will be appreciated that other ADC architectures can be used instead of the SAR ADC and the CT SD ADC, for example flash and pipeline ADC architectures can be used.

The examples of FIGS. 3 and 4 can provide a low power ADC architecture for wideband receiver architecture. Such a receiver can be utilized to receive all the channels present in the industrial, scientific and medical (ISM) radio bands (for example, Wifi, Bluetooth, etc.). The overall ADC functionality provided by the circuit the can have at least 40 MHz bandwidth and can achieve 76 dB dynamic range while consuming only 4 mW of power. The low power and wideband ADC can enable digital processing after conversion. For example, the Bluetooth standard relies on a frequency hopping scheme to create a robust communication link. In a wideband Bluetooth receiver, the frequency hopping scheme can be implemented in digital. This can relax the requirements of the frequency reference of the receiver.

There are many possible applications of the circuits of FIGS. 3 and 4, and also other circuits disclosed herein.
- The circuits can be used to reduce an input signal of an ADC and therefore relax the dynamic range requirement of the ADC.
- In a receiver system, this technique can be used to remove unwanted signals such that the filtering requirements of a radio-frequency (RF) front end can be relaxed.
- In a filter application, this technique can help to reduce the output swing of the filter, and thus can improve the linearity of the filter.
- This technique can be used in multi stage noise shaping (MASH) ADCs where replicas of the quantization noise of the cascaded stages are required.

Figure 5:
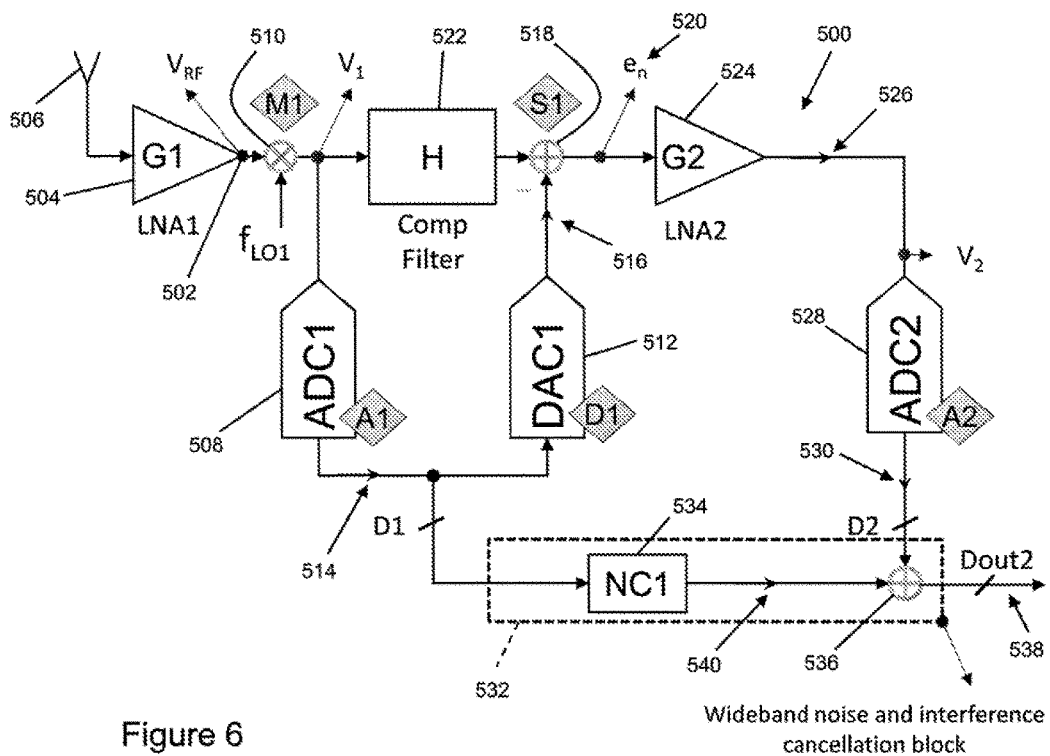
FIG. 5 shows an example embodiment of a receiver circuit.

FIG. 5 shows an example embodiment of a receiver circuit 500. As will be discussed below, it includes a mixer 512 that is upstream of an error-ADC 528. Use of such a mixer can advantageously relax the requirements of the error-ADC 528 without significantly negatively affecting the quality of an error-cancelled-signal 538.

The receiver circuit 500 includes an input terminal 502 that receives an input-signal. In this example, the input signal is provided by the output terminal of a radio-frequency(RF)-LNA (G1) 504, which is connected to an antenna 506 for receiving signals.

The receiver circuit 500 also includes a feedforward-ADC (A1) 508 that provides a feedforward-digital-signal 514 based on the input-signal. In this example, an input-mixer (M1) 510 is provided between the input terminal 502 and the feedforward-ADC (A1) 508 such that a down-converted-input-signal is converted to a digital signal by the feedforward-ADC (A1) 508. Therefore, the feedforward-ADC (A1) 508 can be considered as providing the feedforward-digital-signal 514 based indirectly on the input-signal received at the input terminal 502. The input-mixer (M1) 510 will be discussed in more detail below.

The receiver circuit 500 also includes a feedforward-DAC (D1) 512 that provides a feedforward-analogue-signal 516 based on the feedforward-digital-signal 514. In this example, the feedforward-DAC (D1) 512 receives the feedforward-digital-signal 514 at an input terminal and therefore generates the feedforward-analogue-signal 516 based directly on the feedforward-digital-signal 514. In other examples, additional processing can be performed on the feedforward-digital-signal 508 before it is converted to an analogue signal by the feedforward-DAC (D1) 512, in which case the feedforward-DAC (D1) 512 generates the feedforward-analogue-signal 512 indirectly on the feedforward-digital-signal 508.

A feedforward-subtractor (S1) 518 provides an error-signal ($e_n$) 520 based on the difference between the feedforward-analogue-signal 516 and the input-signal. In this example, both the input-mixer 510 and an optional compensation-filter (H) 522 are connected between the input terminal 502 and the feedforward-subtractor (S1) 518 such that the error-signal ($e_n$) 520 is indirectly based on the input-signal received at the input terminal. The compensation-filter (H) 522 is an example of a delay-block that provides a delayed-input-signal based on the input-signal such that the feedforward-subtractor (S) 518 provides the error-signal ($e_n$) 520 based on the difference between the feedforward-analogue-signal 516 and the delayed-input-signal.

The receiver circuit 500 includes an error-LNA 524 configured to provide an amplified-error-signal 526 based on the error-signal ($e_n$) 520. Then, an error-ADC 528 can provide a digital-amplified-error-signal 530 based on the amplified-error-signal 526. The error-ADC 528 in this example comprises a narrowband ADC. The bandwidth of the error-ADC 528 can be selected according to the bandwidth of a wanted signal. For example, for FM and DAB/ITS applications, the received circuit 500 may include two error-ADCs 528 having respective bandwidths of about 20 MHz and about 80 MHz. In other applications, an error-ADC 528 may have a bandwidth of less than 200, 160, or 100 MHz.

An error-cancellation-block 532 is used to provide an error-cancelled-signal (Dout2) 538 based on a difference between the digital-amplified-error-signal 530 and the feedforward-digital-signal 514. In this example the error-cancellation-block 532 includes a noise cancellation filter 534 and an error-cancellation-subtractor 536. The noise cancellation filter 534 applies a noise-cancellation-transfer-function (NC1) to the feedforward-digital-signal 514 in order to provide a noise-cancelled-feedforward-signal 540. The error-cancellation-subtractor 536 then subtracts the digital-amplified-error-signal 530 from the noise-cancelled-feedforward-signal 540 in order to provide the error-cancelled-signal (Dout2) 538.

Figure 6:
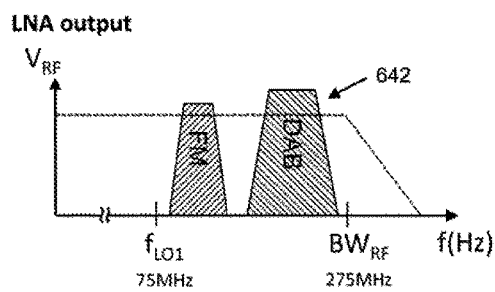
FIG. 6 illustrates example signals in the circuit of FIG. 5.
Figure 6:
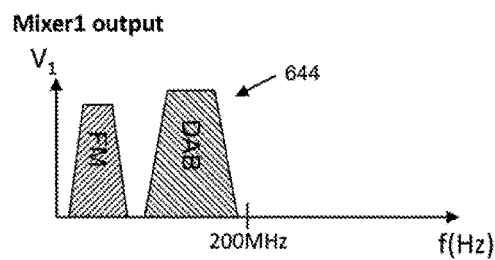

As shown in FIG. 6, the down-converted-input signal that is provided as an input to the feedforward-ADC 508 and the compensation-filter 522 is labelled as $V_1$.

Therefore, the feedforward-digital-signal 514 ($D_1$), provided as the output of the feedforward-ADC 508, can be expressed as:

$$D_1 = STF_1 * V_1 + Q_1$$

Where:
$STF_1$ is the signal transfer function of the feedforward-ADC 508, and
$Q_1$ is the quantization noise of the feedforward-ADC 508.
The error signal ($e_n$) 520 can be expressed as:

$$e_n = V_1(H - STF_1 \cdot STF_{DAC1}) - Q_1$$

Where:
H is the transfer function of the compensation-filter 522, and
$STF_{DAC1}$ is the signal transfer function of the feedforward-DAC 512.
The digital-amplified-error-signal 530, which is the output of the error-ADC 528, can be expressed as:

$$D2 = STF_2 \cdot G2 \cdot (e_n) + Q_2$$

$$D2 = STF_2 \cdot G2 \cdot (V_1(H - STF_1 \cdot STF_{DAC1}) - Q_1) + Q_2$$

Where:
D2 is the digital-amplified-error-signal 530,
$STF_2$ is the signal transfer function of the error-ADC 528, and
Q2 is the quantization noise of the error-ADC 528.
The error-cancelled-signal (Dout2) 538 can be expressed as:

$$D_{out2} = NC1 \cdot D_1 + D_2$$

Where:
NC1 is the noise-cancellation-transfer-function of the noise cancellation filter (NC1) 534.
To cancel the errors introduced by the feedforward-ADC 508, the noise-cancellation-transfer-function can be designed to have the following transfer function:

$$NC1 = G2 \cdot STF_2 \cdot STF_{DAC1}$$

Then Dout2 simplifies to:

$$D_{out2} = H \cdot STF_2 \cdot G2 \cdot V_1 + Q_2$$

As mentioned above, the receiver circuit 500 includes an input-mixer 510. In this example the input-mixer 510 down converts the input signal using a local oscillator signal ($f_{LO1}$). The local oscillator (LO) frequency can be selected relative to the lowest frequency of the wanted application. The exact LO frequency can be set for a specific application and may depend on many factors such as: the implementation of the divider ratio, interference, etc.

The input-mixer 510 is an example of a mixer that can down-convert a signal in a signal path between the input terminal 502 and the error-ADC 528. That is, the mixer can be provided upstream of the error-ADC 528. Various alternative and additional locations of the mixer will be discussed below. Use of such a mixer is advantageous because it relaxes the requirements of one or more of the error-ADC 528, the feedforward-ADC 508 and the feedforward-DAC 512 without significantly negatively affecting the quality of the error-cancelled-signal (Dout2) 538.

In FIG. 5, the input-mixer 510 is positioned after the RF-LNA (G1) 504 such that the input signal received at the input terminal 502 is down-converted before it is further processed by the receiver circuit 500. The input-mixer 510 down converts the input signal (which includes the desired signal and also the unwanted blockers) in order to also relax the requirements of the feedforward-ADC 508 in this example. As discussed above the feedforward-ADC 508 converts both the desired signal and unwanted blockers (in band and out of band). Since the signals are down converted to lower carrier frequency, the speed requirements of the feedforward-ADC 508 and the feedforward-DAC 512 are advantageously relaxed.

In this example, the feedforward-ADC 508 comprises a wideband ADC and the feedforward-DAC 512 comprises a wideband DAC. The bandwidth of the feedforward-ADC 508 and the feedforward-DAC 512 can be scaled with respect to unwanted out-of-band blockers, which can depend on the application. In this way, the feedforward-ADC 508 and the feedforward-DAC 512 convert both the desired signal and unwanted blockers.

For an application bandwidth of 200 MHz, the wideband feedforward-ADC 508 and/or feedforward-DAC 512 may have a bandwidth of greater than 1, 2 or 3 GHz (for example a bandwidth of 3.2 GHz) or a sampling rate of greater than 2, 4 or 6 GHz (for example a sampling rate of 6.4 GHz).

Since the feed-forward ADC & DAC 508, 512 combination is intended to cancel the out-of-band blockers, we can express the bandwidth of the feed-forward ADC 508 as:

$$BW_{FF-ADC} = OSR * f_{OOB}$$

Where:
OSR is the oversampling ratio of the wideband feedforward-ADC 508, and
$f_{OOB}$ is the frequency of the out-of-band blocker.

The bandwidth of the feedforward-DAC 512 can be similar or the same as the feed-forward ADC 508.

FIG. 6 shows:
- an example frequency spectrum of an input signal 642 that can be received at the input terminal of FIG. 5 from the RF-LNA;
- an example frequency spectrum of a down-converted-input-signal 644 that is output by the input-mixer of FIG. 5; and
- as a dashed line, an example of the bandwidth of the RF-LNA.

As shown in FIG. 6, the input signal 642 includes FM and DAB components, in line with their associated radio standards. The DAB signal (which starts from 170 MHz) in the input signal 642 is located close to the FM signal (which stops around 110 MHz), and therefore can be considered as an out-of-band blocking signal. The feedforward-ADC (A1) in FIG. 5 is a wide band ADC in this example and requires 3.2 GHz bandwidth to digitize both the wanted (FM) and unwanted (DAB) signal. The error-ADC in FIG. 5 is narrow band ADC in this example and requires 20 MHz bandwidth to receive FM application. The feedforward-ADC 508 has a 3.2 GHz bandwidth.

Bandwidth Application>200 MHz→$BW_{ADC1}$=OSR*$BW_{Application}$=3.2 GHz (OSR=16)
Bandwidth FM>20 MHz+$BW_{ADC2}$
Bandwidth DAB~80 MHz.

Figure 7:
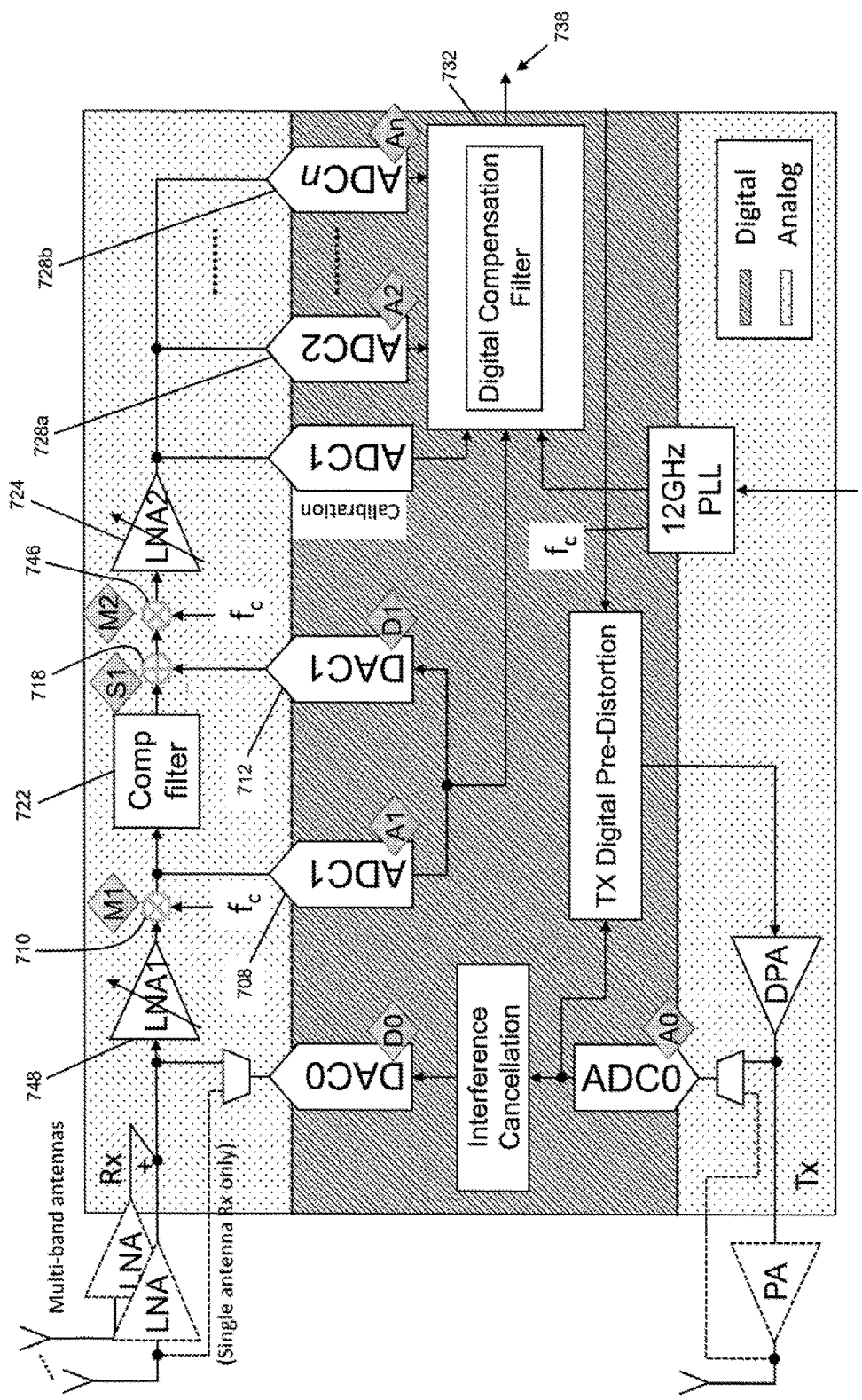
FIG. 7 shows a transceiver front-end architecture that includes mixers in the signal path.

FIG. 7 shows a transceiver (TRx) front-end architecture that includes mixers in the signal path. Components of FIG. 7 that have already been described with reference to FIG. 5 have been given corresponding numbers in the 700 series, and will not necessarily be described again here. The error-cancellation-block 732 in this example includes a digital compensation filter.

The feedforward-ADC (A1) 708 in this example is a low resolution wideband ADC, which is designed to digitize blockers that can limit the performance of the receiver.

The feedforward-DAC (D1) 712 in this example is a law resolution DAC. It can be implemented as a 1 bit or multi-bit configuration. Depending on the target application the accuracy requirements of the feedforward-DAC (D1) 712 can be configured, as will be discussed in more detail below with reference to FIG. 10.

In this example the circuit includes a plurality of error-ADCs 728a, 728b (which may also be referred to as back-end ADCs) in parallel with each other. These ADCs define the final accuracy of the receiver. They can be implemented as a configurable ADC or multiple back-end ADCs (as shown in FIG. 7). The final use case will depend on the application. For example, if a 1 GHz bandwidth is required, then 4 error-ADCs, each having a 250 MHz bandwidth, can be used with each error-ADC tuned to centre frequencies such that the aggregate bandwidth is 1 GHz.

The circuit of FIG. 7 includes an error-mixer 746 that mixes the error-signal with a mixing frequency ($f_c$) in order to provide a down/up-converted-error-signal. The error-mixer 746 is positioned before the error-LNA 724. In this way, the error-LNA 724 provides the amplified-error-signal based on the down/up-converted-error-signal received from the error-mixer 746.

The error-mixer 746 can be used in circuits that also include an input-mixer 710 (as shown in FIG. 7), and also in circuits that do not include the input-mixer 710. For an example circuit that does not include the input-mixer 710, the feedforward-ADC 708 and the feedforward-DAC 712 path can cancel the unwanted blockers from the input signal that passes through the compensation-filter 722. (The feedforward-subtractor (S1) 718 subtracts the signal from its digitized version to generate the error signal.) The error-mixer 746 then down converts a very small error signal, which can be very wide bandwidth (as defined by the bandwidth of an input-LNA 748 and the compensation-filter 722), to a down-converted-error-signal having a lower intermediate frequency. In this way, the lower intermediate frequency down-converted-error-signal can be processed by the error-LNA 724 and the error-ADCs 728a, 728b. This can be considered advantageous because the bandwidth requirements of the error-ADCs 728a, 728b can be relaxed.

The error-mixer 746 can also be used in a circuit that includes the input-mixer 710. In this case, the input-mixer 710 can down convert the input signal as discussed above, and then the error-mixer 746 can up convert the error signal to provide an upconverted-error-signal. The upconverted-error-signal can have a frequency which is advantageous for the error-LNA 724 and the error-ADCs 728a, 728b. The mixing frequencies ($f_c$) that are applied by the input-mixer 710 and the error-mixer 746 may the same as each other, or may be different.

Figure 8:
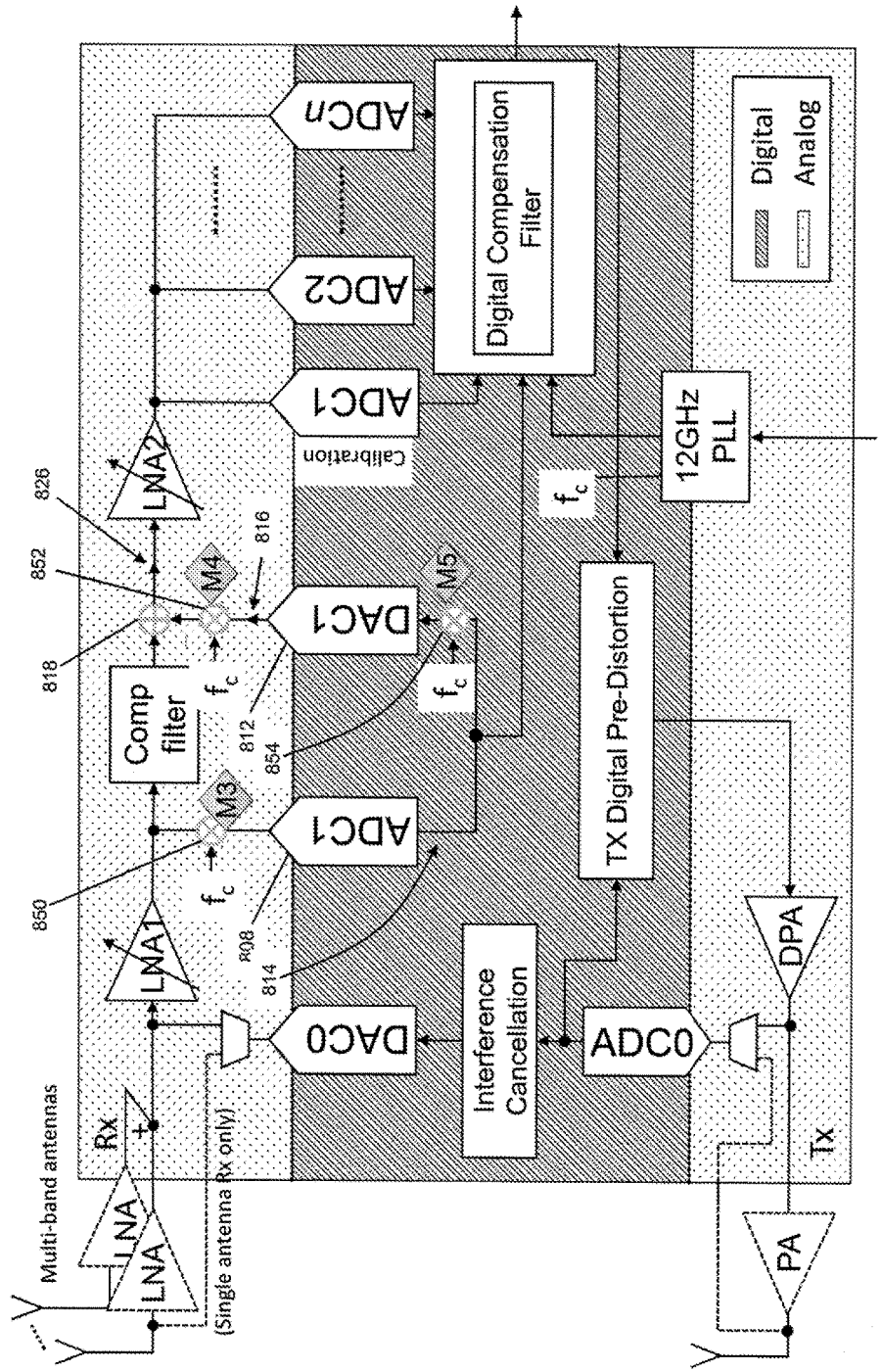
FIG. 8 shows a transceiver front-end architecture that includes mixers in the auxiliary (feedforward) path.

FIG. 8 shows a transceiver (TRx) front-end architecture that includes mixers in the auxiliary (feedforward) path. Components of FIG. 8 that have already been described with reference to FIG. 7 have been given corresponding numbers in the 800 series, and will not necessarily be described again here.

In this example, the input-mixer and error-mixer of FIG. 7 have been moved into the auxiliary/feedforward path.

Instead of an input-mixer, the circuit of FIG. 8 includes a feedforward-input-mixer 850 that down-converts the input-signal in order to provide a down-converted-input-signal. In contrast to the input-mixer of FIG. 7, the feedforward-input-mixer 850 down-converts the signal that takes the feedforward path, but does not down-convert the signal that takes the main signal path to the feedforward-subtractor (S1) 818. In this way, the feedforward-ADC 808 provides the feedforward-digital-signal 814 based on the down-converted-input-signal (provided as an output signal by the feedforward-input-mixer 850). However, the feedforward-subtractor 818 provides the error-signal based on the difference between the feedforward-analogue-signal (in this example a down-converted-feedforward-analogue-signal, as discussed below) and the input-signal. The signal that is provided as an input to the feedforward-ADC 808 is a down-converted version of the signal that is provided as an input to the feedforward-subtractor 818.

Instead of an error-mixer, the circuit of FIG. 8 includes a feedforward-analogue-mixer 852 that is configured to down-convert the feedforward-analogue-signal 816 in order to provide a down-converted-feedforward-analogue-signal. The feedforward-subtractor 818 then provides the error-signal 826 based on the difference between the down-converted-feedforward-analogue-signal (provided as an output signal by the feedforward-analogue-mixer 852) and the input-signal.

As an alternative to the feedforward-analogue-mixer 852, the circuit of FIG. 8 can include a feedforward-digital-mixer 854 that down-converts the feedforward-digital-signal in order to provide a down-converted-feedforward-digital-signal. The feedforward-DAC 812 then provides the feedforward-analogue-signal 816 based on the down-converted-feedforward-digital-signal.

Figure 9:
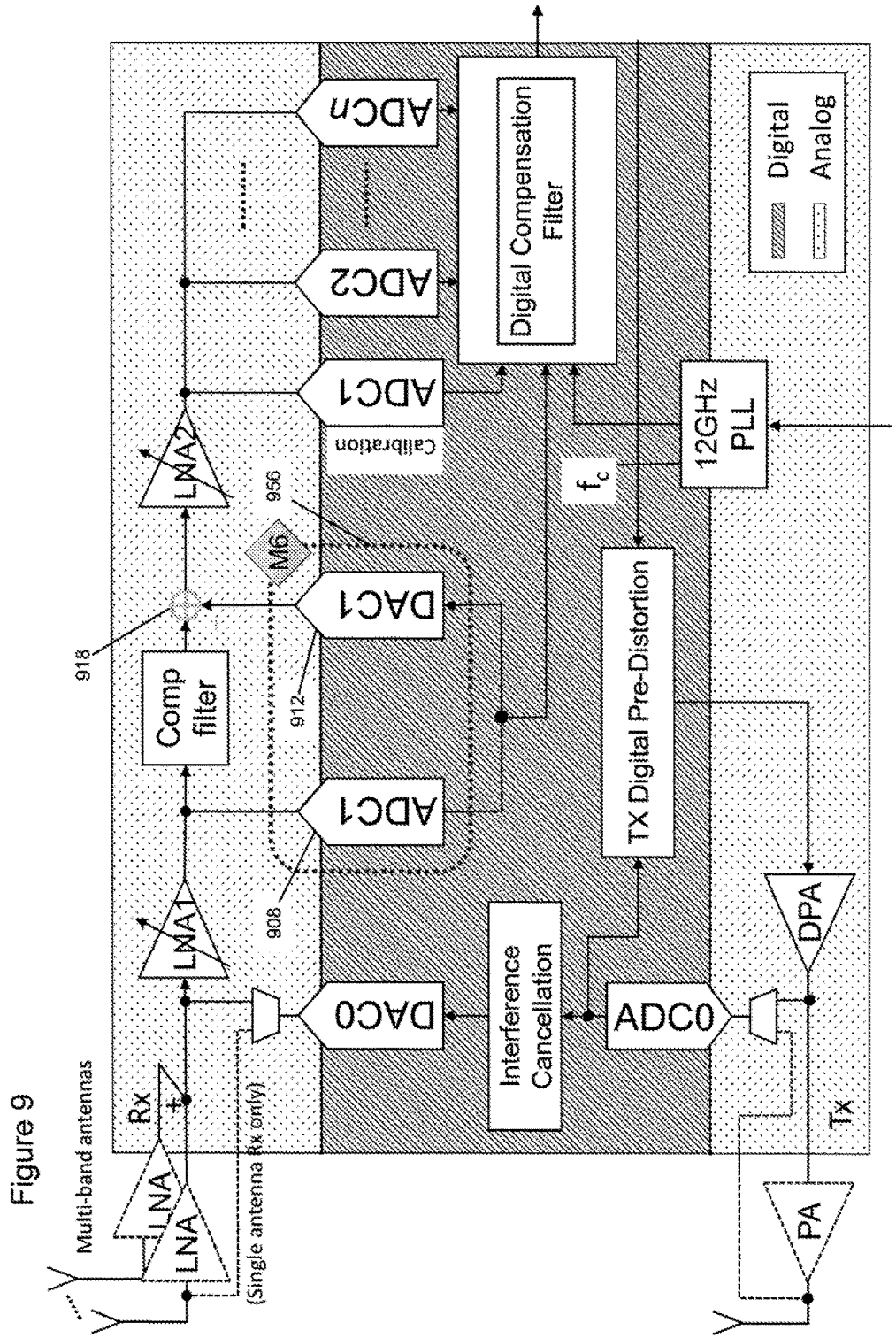
FIG. 9 shows a transceiver front-end architecture that utilises inherent aliasing characteristics of the feedforward-ADC and the feedforward-DAC to provide the functionality of a mixer.

FIG. 9 shows a transceiver (TRx) front-end architecture that utilises inherent aliasing characteristics of the feedforward-ADC 908 and the feedforward-DAC 912 to provide the functionality of a mixer. Components of FIG. 9 that have already been described with reference to FIG. 7 have been given corresponding numbers in the 900 series, and will not necessarily be described again here.

The mixer functionality provided by the feedforward-ADC 908 and the feedforward-DAC 912 can correspond to that provided in FIG. 8 by: (i) the feedforward-input-mixer; and (ii) the feedforward-analogue-mixer or the feedforward-digital-mixer. This mixer functionality is illustrated schematically in FIG. 9 with reference 956.

In this example, the frequency dependent gain transfer function of the feedforward-ADC 908 and the feedforward-DAC 912 configuration can be taken into account since the cancellation at the feedforward-subtractor 918 can utilise gain matching between the main and auxiliary signal paths. In this embodiment, the use of the mixer functionality can relax the requirements of the feedforward-ADC 908 and the feedforward-DAC 912 without significantly negatively affecting the quality of the error-cancelled-signal.

Figure 10:
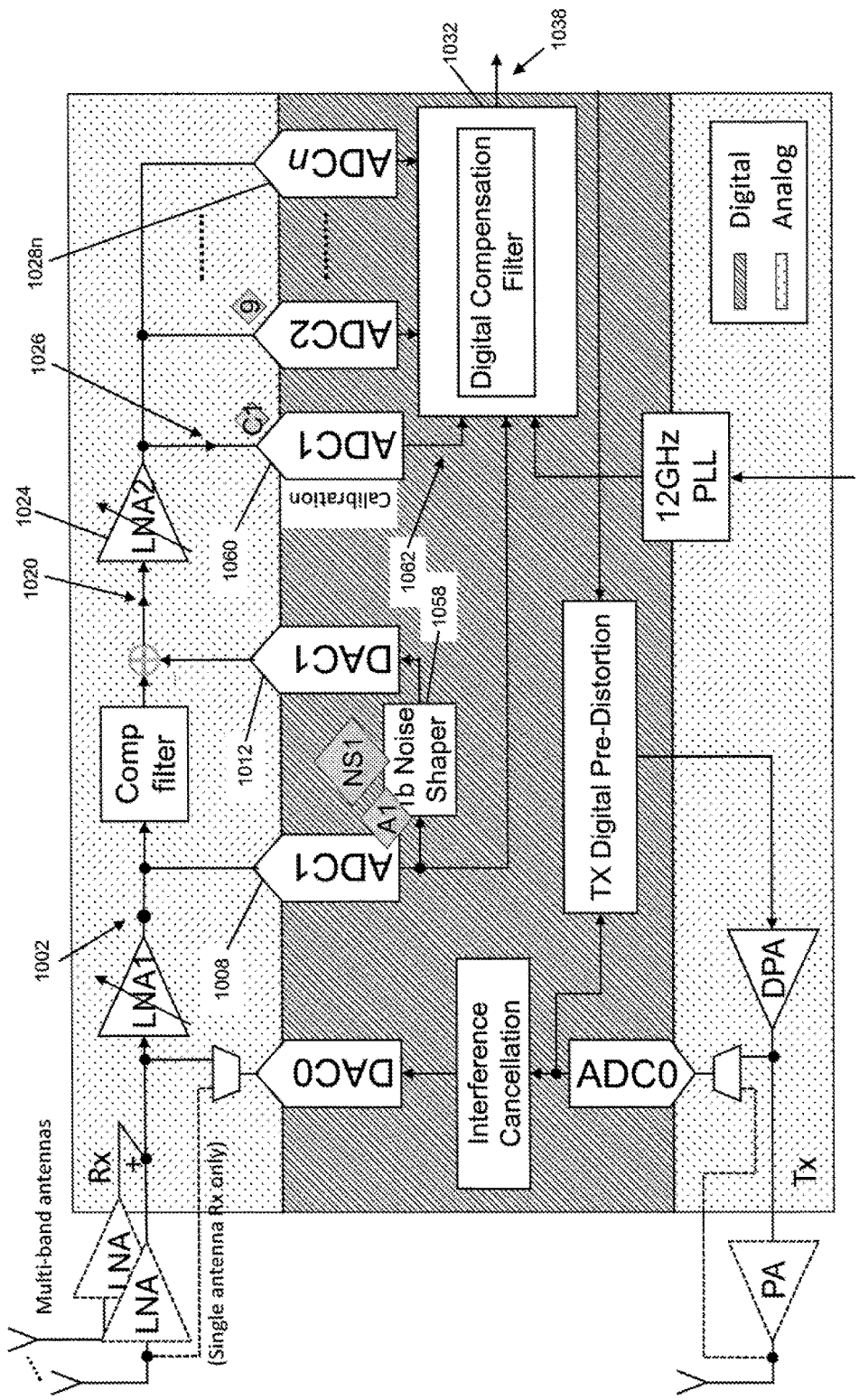
FIG. 10 shows a transceiver front-end architecture that includes a digital-noise-shaper.

FIG. 10 shows a transceiver (TRx) front-end architecture that includes a digital-noise-shaper 1058. Components of FIG. 10 that have already been described with reference to FIG. 7 have been given corresponding numbers in the 1000 series, and will not necessarily be described again here.

The digital-noise-shaper 1058 receives the feedforward-digital-signal from the feedforward-ADC 1008, and provides a noise-shaped-feedforward-signal as an output signal. The feedforward-DAC 1012 can then provide the feedforward-analogue-signal based on the noise-shaped-feedforward-signal. In this example, the digital-noise-shaper 1058 can generate 1-bit noise shaped digital signal from a multi-bit feedforward-digital-signal. This can be advantageous because a 1-bit DAC1 can be used which is inherently linear.

In FIG. 10, the feedforward-digital-signal from the feedforward-ADC 1008 (and not the noise-shaped-feedforward-signal) is provided to the error-cancellation-block 1032 for generating the error-cancelled-signal 1038.

In applications such as analogue broadcasting radios (AM/FM), the receiver should achieve very good linearity. Therefore, it is undesirable for the linearity requirement of the auxiliary/feedforward path (through the feedforward-ADC 1008, and the feedforward-DAC 1012), which is used to cancels blockers, to limit the receiver performance. In the example of FIG. 10, the digital-noise-shaper (NS1) is introduced between the feedforward-ADC 1008 and the feedforward-DAC 1012 such that a linear 1-bit DAC can be connected to such a digital noise shaper in the feedforward path, whilst still enabling the higher resolution version of the feedforward-digital-signal to be used by the error-cancellation-block 1032. The digital-noise-shaper 1058 can be implemented using a digital sigma-delta modulator.

In some examples, the functionality of the digital-noise-shaper 1058 and the feedforward-DAC 1012 can be combined into a noise shaping DAC.

FIG. 10 also shows a calibration-ADC 1060 that provides a calibration-error-signal 1062 based on the amplified-error-signal 1026. The calibration-ADC 1060 converts the amplified-error-signal 1026 to a digital signal (the calibration-error-signal 1062) that is provided as an input to the error-cancellation-block 1032. In this way, a calibration-feedback-path is provided. More particularly, in this example, the calibration-error-signal 1062 is provided as an input to a wideband-blocker-cancellation-block (not shown) of the error-cancellation-block 1032.

The calibration-error-signal 1062 is used to calibrate the circuit of FIG. 10. The calibration-ADC 1060 can have a similar, or the same, speed and accuracy requirements as the feedforward-ADC 1008, and can be used to measure non-idealities that are introduced by the feedforward-DAC 1012 and/or the error-LNA 1024. In this example, the non-idealities introduced by the feedforward-ADC 1008 may not be critical because they are measured by the error-ADCs 1028$n$ and can be cancelled in the error-cancellation-block 1032. If needed, any errors introduced by the feedforward-ADC 1008 can also be measured by the calibration-ADC 1060. The calibration ADC 1060 is connected to the output of the error-LNA 1024 such that the error-cancellation-block 1032 can calibrate out the non-idealities that increase the error signal 1020, for example due to a bandwidth mismatch of active blocks or filters, etc.

The error-cancellation-block 1032 can use the calibration-error-signal 1062 to improve the matching between the gain and bandwidth of the feedforward path to those of the signal path. For example, one or more components in the feedforward path and/or the compensation filter may comprise variable components, and the error-cancellation-block 1032 can set component/operational parameters of these components based on the calibration-error-signal 1062. These component/operational parameters can be set digitally or with an analogue signal. For instance, the gain of the feedforward-DAC 1012, the delay of the feedforward-DAC 1012, and compensation filter coefficients can be tuned. In this way the error-cancellation-block 1032 can set component/operational parameters for one or more components in a signal path between the input terminal 1002 and the error-ADC 1028$n$.

This functionality can be possible because the output of the calibration-ADC 1060 can provide information regarding the out-of-band test-signal/blocker, which can be used by the error cancellation block 1032. In this way, the error-signal 1020 can be minimized or reduced for an out-of-band test-signal/blocker.

In other examples, a calibration-feedback-path can be provided that does not include a calibration-ADC 1060, yet still provides a calibration-error-signal 1062 to the error-cancellation-block 1032.

For applications that target AM, FM use cases, the feedforward-DAC 1012 should not limit the linearity of the receiver. In such a use case, the digital-noise-shaper 1058 can be followed by a multi-tap FIRDAC (finite impulse response DAC) which is inherently linear and filters the out of band noise of the digital-noise-shaper 1058. The use of a multi-tap FIRDAC as the feedforward-DAC 1012 can also relax the jitter requirement of the high frequency clock of the feedforward-DAC 1012. Furthermore, the transfer function of the FIRDAC can be matched with the transfer function of the compensation path.

Figure 11:
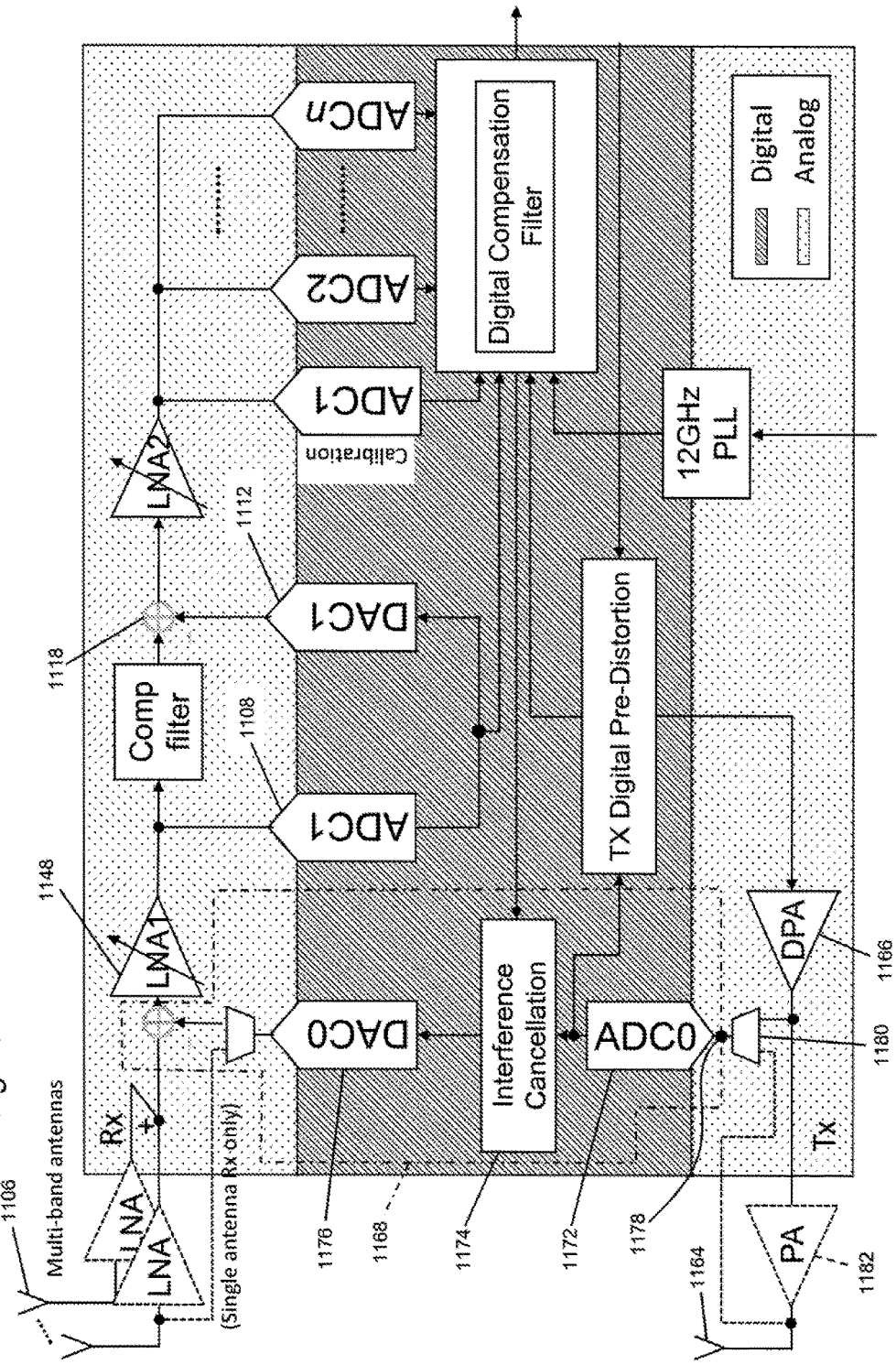
FIG. 11 shows a transceiver front-end architecture that includes transmitter (TX) blocker cancellation.

FIG. 11 shows a transceiver (TRx) front-end architecture that includes transmitter (TX) blocker cancellation. Components of FIG. 11 that have already been described with reference to FIG. 7 have been given corresponding numbers in the 1100 series, and will not necessarily be described again here.

The circuit of FIG. 11 includes (or is connected to) one or more receiver antennas 1106, and at least one transmitter antenna 1164. Transmitter signals are fed to the transmitter antenna 1164 by means of a digital pre-amplifier 1166. The signals transmitted by the transmitter antenna 1164 can couple to the one or more receiver antennas 1106. This can introduce a blocker scenario, which can limit the performance of the receiver.

The circuit of FIG. 11 includes an interference-compensator 1168 for measuring the transmitter (TX) signals, modelling the coupling path from the transmitter antenna 1164 to the receiver antenna 1006, and removing the associated unwanted blocker signal at the input of the input-LNA 1148. As will be discussed below, the interference-compensator 1168 in this example includes an interference-compensation-ADC 1172, an interference-cancellation-block 1174 and an interference-compensation-DAC 1176.

The circuit of FIG. 11 includes an interference-input terminal 1178 configured to receive an interference-input-signal representative of a transmitted-signal from the co-located transmitter antenna 1164. In this example, the interference-input terminal 1178 is connected to the output terminal of a multiplexor 1180 such that it can either receive: an interference-input-signal from the output of an internal digital pre-amplifier 1166; or an interference-input-signal from the output of an external digital pre-amplifier 1182.

The interference-compensation-ADC 1072 of the interference-compensator 1168 converts the interference-input-signal received at the interference-input terminal 1178 into a digital-interference-signal. The interference-cancellation-block 1174 generates a modelled-interference-signal 1184 based on: (i) a model of a signal coupling path between the transmitter antenna 1164 and the receiver antenna 1106; and (ii) the interference-input-signal. The main role of the interference-cancellation-block 1174 is to model/match the coupling path between the transmitter antenna 1164 and the receiver antennas 1106. Internal parameters of the interference-cancellation-block 1174 can be tuned in accordance with the digital-interference-signal in order to achieve improved/optimal blocker rejection from the transmitter to the receiver by mimicking the transfer function of the environment between the transmitter antenna 1164 and the receiver antennas 1106.

The interference-compensator can then provide the compensated-input-signal based on the modelled-interference-input-signal and the input-signal. In this example, the interference-compensation-DAC 1176 converts the modelled-interference-signal 1184 into an analogue-modelled-interference-signal 1184, and the compensated-input-signal is based on the analogue-modelled-interference-signal 1184. In this way, the interference-compensation-DAC 1176 provides a replica of the TX blocker with proper amplitude scaling and phase alignment (as created by the interference-cancellation-block 1174). The interference-compensation-DAC 1176 should achieve the same noise figure as the input-LNA 1148.

The interference-compensator provides a compensated-input-signal to the main and feedforward signal paths of the receiver circuit (in this example via an optional input-LNA 1148). The compensated-input-signal is based on the interference-input-signal and the input-signal received from the receiver antennas 1106. The feedforward-ADC 1108 can then provide the feedforward-digital-signal based on the compensated-input-signal, and the feedforward-subtractor 1118 can provide the error-signal based on the difference between the feedforward-analogue-signal and the compensated-input-signal.

In this example, the interference-compensation-ADC 1172 is a wideband ADC, which can capture the TX bandwidth and its higher harmonics. The information regarding the higher harmonics can be used to enable digital pre-distortion algorithms, that are known to be used in transmitters.

Optionally, the interference-compensator 1168 can be operated in accordance with an operating-state of the transmitter. For example, the interference-compensator 1168 may be configured to only provide the compensated-input-signal when the transmitter is an active-operating-state.

It will be appreciated that various functionality that is described herein can be performed in either the analogue or digital domain, and therefore one or more ADCs and DACs can be dispensed with, or additional ADCs and DACs can be included.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A receiver circuit comprising:
   an input terminal configured to receive an input-signal;
   a feedforward-ADC configured to provide a feedforward-digital-signal based on the input-signal;
   a feedforward-DAC configured to provide a feedforward-analogue-signal based on the feedforward-digital-signal;
   a feedforward-subtractor configured to provide an error-signal based on the difference between the feedforward-analogue-signal and the input-signal;
   a low pass filter between the feedforward-DAC and the feedforward-subtractor;
   an error-LNA configured to provide an amplified-error-signal based on the error-signal;
   an error-ADC configured to provide a digital-amplified-error-signal based on the amplified-error-signal;
   a mixer configured to down-convert a signal in a signal path between the input terminal and the error-ADC; and
   an error-cancellation-block configured to provide an error-cancelled-signal based on a difference between the digital-amplified-error-signal and the feedforward-digital-signal, wherein the mixer comprises an error-mixer configured to down-convert the error-signal in order to provide a down-converted-error-signal, wherein the error-LNA is configured to provide the amplified-error-signal based on the down-converted-error-signal.

2. The receiver circuit of claim 1, wherein the mixer comprises an input-mixer configured to down-convert the input-signal in order to provide a down-converted-input-signal, wherein the feedforward-ADC is configured to provide the feedforward-digital-signal based on the down-converted-input-signal, and wherein the feedforward-subtractor is configured to provide the error-signal based on the difference between the feedforward-analogue-signal and the down-converted-input-signal.

3. The receiver circuit of claim, 1 wherein the mixer comprises a feedforward-input-mixer configured to down-convert the input-signal in order to provide a down-converted-input-signal, wherein the feedforward-ADC is configured to provide the feedforward-digital-signal based on the down-converted-input-signal, the feedforward-subtractor is configured to provide the error-signal based on the difference between the feedforward-analogue-signal and the input-signal, and wherein the signal that is provided as an input to the feedforward-ADC is a down-converted version of the signal that is provided as an input to the feedforward-subtractor.

4. The receiver circuit of claim 1, wherein the mixer comprises a feedforward-analogue-mixer configured to down-convert the feedforward-analogue-signal in order to provide a down-converted-feedforward-analogue-signal, wherein the feedforward-subtractor is configured to provide an error-signal based on the difference between the down-converted-feedforward-analogue-signal and the input-signal.

5. The receiver circuit of claim 1, wherein the mixer comprises a feedforward-digital-mixer configured to down-convert the feedforward-digital-signal in order to provide a down-converted-feedforward-digital-signal, wherein the feedforward-DAC is configured to provide the feedforward-analogue-signal based on the down-converted-feedforward-digital-signal.

6. The receiver circuit of claim 1, wherein the mixer comprises inherent aliasing characteristics of the feedforward-ADC and the feedforward-DAC.

7. The receiver circuit of claim 1, wherein the feedforward-ADC comprises a wideband ADC and wherein the feedforward-DAC comprises a wideband DAC.

8. The receiver circuit of claim 1, further comprising a delay-block configured to provide a delayed-input-signal based on the input-signal, and wherein the feedforward-subtractor is configured to provide the error-signal based on the difference between the feedforward-analogue-signal and the delayed-input-signal.

9. The receiver circuit of claim 1, further comprising:
   an interference-input terminal configured to receive an interference-input-signal representative of a transmitted-signal from a co-located transmitter; and
   an interference-compensator configured to provide a compensated-input-signal based on the interference-input-signal and the input-signal, wherein the feedforward-ADC is configured to provide the feedforward-digital-signal based on the compensated-input-signal, and wherein the feedforward-subtractor is configured to provide the error-signal based on the difference between the feedforward-analogue-signal and the compensated-input-signal.

10. The receiver circuit of claim 9, wherein the interference-compensator comprises an interference-cancellation-block configured to generate a modelled-interference-signal based on: (i) a model of a signal coupling path between transmitter and receiver antennas; and (ii) the interference-input-signal, and wherein the interference-compensator is configured to provide the compensated-input-signal based on the modelled-interference-input-signal and the input-signal.

11. The receiver circuit of claim 9, wherein the interference-compensator is configured to be operated in accordance with an operating-state of the transmitter.

12. The receiver circuit of claim 1, further comprising a digital-noise-shaper configured to generate a 1-bit noise-shaped-feedforward-signal based on the feedforward-digital-signal, and wherein the feedforward-DAC is configured to provide the feedforward-analogue-signal based on the noise-shaped-feedforward-signal.

13. The receiver circuit of claim 1, further comprising a calibration-feedback-path configured to provide a calibration-error-signal based on the amplified-error-signal to the error-cancellation-block, and wherein the error-cancellation-block is configured to set component/operational parameters for one or more components in a signal path between the input terminal and the error-ADC.

14. The receiver circuit of claim 1, wherein the feedforward-DAC comprises a multi-tap FIRDAC.

15. A receiver circuit comprising:
   an input terminal configured to receive an input-signal;
   a feedforward-ADC configured to provide a feedforward-digital-signal based on the input-signal;
   a feedforward-DAC configured to provide a feedforward-analogue-signal based on the feedforward-digital-signal;
   a feedforward-subtractor configured to provide an error-signal based on the difference between the feedforward-analogue-signal and the input-signal;

an error-LNA configured to provide an amplified-error-signal based on the error-signal;

an error-ADC configured to provide a digital-amplified-error-signal based on the amplified-error-signal;

a mixer configured to down-convert a signal in a signal path between the input terminal and the error-ADC; and an error-cancellation-block configured to provide an error-cancelled-signal based on a difference between the digital-amplified-error-signal and the feedforward-digital-signal, wherein the mixer comprises an input-mixer configured to down-convert the input-signal in order to provide a down-converted-input-signal, wherein the feedforward-ADC is configured to provide the feedforward-digital-signal based on the down-converted-input-signal, and wherein the feedforward-subtractor is configured to provide the error-signal based on the difference between the feedforward-analogue-signal and the down-converted-input-signal.

16. A receiver circuit comprising:

an input terminal configured to receive an input-signal;

a feedforward-ADC configured to provide a feedforward-digital-signal based on the input-signal;

a feedforward-DAC configured to provide a feedforward-analogue-signal based on the feedforward-digital-signal;

a feedforward-subtractor configured to provide an error-signal based on the difference between the feedforward-analogue-signal and the input-signal;

a low pass filter between the feedforward-DAC and the feedforward-subtractor;

an error-LNA configured to provide an amplified-error-signal based on the error-signal;

an error-ADC configured to provide a digital-amplified-error-signal based on the amplified-error-signal;

a mixer configured to down-convert a signal in a signal path between the input terminal and the error-ADC; and an error-cancellation-block configured to provide an error-cancelled-signal based on a difference between the digital-amplified-error-signal and the feedforward-digital-signal, wherein the mixer comprises an input-mixer configured to down-convert the input-signal in order to provide a down-converted-input-signal, wherein the feedforward-ADC is configured to provide the feedforward-digital-signal based on the down-converted-input-signal, and wherein the feedforward-subtractor is configured to provide the error-signal based on the difference between the feedforward-analogue-signal and the down-converted-input-signal.

* * * * *